US007172790B2

(12) United States Patent
Koulik et al.

(10) Patent No.: US 7,172,790 B2
(45) Date of Patent: Feb. 6, 2007

(54) METHOD OF PRODUCING POWDER WITH COMPOSITE GRAINS AND THE DEVICE FOR CARRYING OUT SAID METHOD

(75) Inventors: Pavel Koulik, Blaesheim (FR); Evguenii Petrov, Illkirch-Graffenstaden (FR); Mark Ivanov, Illkirch-Graffenstaden (FR)

(73) Assignee: APIT Corp. SA, Sion (CH)

( * ) Notice: Subject to any disclaimer, the term of this patent is extended or adjusted under 35 U.S.C. 154(b) by 151 days.

(21) Appl. No.: 10/486,888

(22) PCT Filed: Sep. 2, 2002

(86) PCT No.: PCT/IB02/03551

§ 371 (c)(1),
(2), (4) Date: Feb. 12, 2004

(87) PCT Pub. No.: WO03/018185

PCT Pub. Date: Mar. 6, 2003

(65) Prior Publication Data

US 2004/0238345 A1 Dec. 2, 2004

(30) Foreign Application Priority Data

Aug. 31, 2001 (EP) .................................. 01120974

(51) Int. Cl.
*B05D 7/00* (2006.01)
(52) U.S. Cl. ...................... 427/212; 427/215; 427/569; 118/723 R; 118/723 E
(58) Field of Classification Search ................ 427/569, 427/212, 215; 118/723 R, 723 E
See application file for complete search history.

(56) References Cited

U.S. PATENT DOCUMENTS

| | | | |
|---|---|---|---|
| 3,247,014 A | 4/1966 | Baroch et al. | |
| 4,612,432 A | 9/1986 | Sharp-Geisler | |
| 4,859,493 A | 8/1989 | Lemelson | |
| 5,298,296 A * | 3/1994 | Kojima et al. | ............... 427/600 |
| 5,340,618 A * | 8/1994 | Tanisaki et al. | ............. 427/488 |
| 5,364,562 A * | 11/1994 | Wang | ................... 423/594.16 |
| 5,408,066 A * | 4/1995 | Trapani et al. | ......... 219/121.47 |
| 5,569,502 A | 10/1996 | Koinuma et al. | |
| 5,609,921 A * | 3/1997 | Gitzhofer et al. | ........... 427/446 |
| 5,846,600 A * | 12/1998 | Yamada et al. | .............. 427/213 |
| 5,876,683 A * | 3/1999 | Glumac et al. | .............. 423/325 |
| 6,015,597 A | 1/2000 | David | |
| 6,113,700 A | 9/2000 | Choi | |
| 6,156,114 A | 12/2000 | Chouinard | |
| 6,365,235 B2 * | 4/2002 | Koulik et al. | ................ 427/525 |
| 6,653,591 B1 * | 11/2003 | Peterson et al. | ....... 219/121.47 |

FOREIGN PATENT DOCUMENTS

| | | |
|---|---|---|
| DE | 100 03 982 A | 8/2000 |
| WO | WO 01 03163 A | 1/2001 |

* cited by examiner

*Primary Examiner*—Bret Chen
(74) *Attorney, Agent, or Firm*—Clifford W. Browning; Krieg DeVault LLP

(57) ABSTRACT

A method of producing powder formed of composite grains comprising a kernel and one or more surface layers. The inventive method comprises the following steps: mixing the grain kernels with a plasmochemical treatment gas; making said kernel/treatment gas mixture flow through a main plasma reactor; and generating a uniform plasma essentially at atmospheric pressure in a treatment region of the main reactor in order to create a plasmochemical reaction between the treatment gas and the surfaces of the kernels so that surface layers form on said surfaces while the mixture flows through the reactor.

25 Claims, 3 Drawing Sheets

METHOD OF PRODUCING POWDER WITH COMPOSITE GRAINS AND THE DEVICE FOR CARRYING OUT SAID METHOD

The present invention relates to a method for producing a powder made of composite grains and to a device for carrying out this method.

In the field of powders, several methods are known for producing powders and amongst them, methods for producing powders through the use of a plasma.

In certain methods, the plasma is used mainly as a source of heat, for vaporising or melting an agglomerate or a solid material, for the purpose of forming nanometric or submicronic particles upon condensation and cooling of the particles downstream of the source of plasma. However, these methods cannot be used for producing composite grains comprised of a core and of very thin and uniform surface layers, made of some other material.

In addition to the methods based mainly on the thermal effect of the plasma, methods are also known for the treatment of the surface of the grains of a powder, in which the plasma is used for activating the surface of the grains in order to change the properties of these grains, such as is described, for instance, in the publications DE 196 122 70, DE 195 021 87, EP 654 444, WO 9118124 and U.S. Pat. No. 5,278,384. In the two last publications, there is disclosed, in particular, the formation of a composite powder comprised of cores surrounded by a surface layer of another material deposited through the activation of the surface of the core by a plasma at a low temperature.

A major drawback of these methods is that the plasma treatment is carried out at a low pressure, i. e. under a partial vacuum, which accordingly increases the complexity, the time needed and the manufacturing costs when the powder is produced industrially. In this respect, it is to be noted that the low pressure decreases the speed of the treatment by the plasma and, accordingly, the productivity of the process. On the other hand, the use of a low-pressure plasma promotes the activation of the surface of the materials and the plasmochemical reactions and, further, makes it possible to carry out easily a uniform treatment of a large volume.

One aim of the invention is to provide a method for producing a powder comprised of composite grains and a device for carrying out this method, which are inexpensive, effective and reliable when applied industrially.

It is advantageous to provide a method for producing a powder comprised of composite grains having a core and one or several surface layers surrounding the core, and a device carrying out the method, which make it possible to control the uniformity or the thickness of the surface layer surrounding the core, made of some other material.

It is advantageous to provide a method for producing a powder comprised of composite grains and a device for carrying out the method, which make it possible to produce grains having a submicronic or a nanometric size. It is also advantageous to be able to produce grains having a core and several thin surface layers made from different materials, molecules or atoms.

It is advantageous to produce powder made of composite grains having a core and one or several surface layers surrounding the core, said powder acquiring thereby physicochemical properties which are different from the properties of the core.

The aims of the invention are achieved by a method for producing a powder of composite grains according to claim 1, a device for carrying out the method according to claim 11 and a hydrodynamic filter for a plasma reactor according to claim 22.

In the present invention, a method for producing a powder made of composite grains having a core and one or several surface layers includes the steps of: mixing grain cores with a plasmochemical treatment gas, passing the mixture of the cores and the plasmochemical treatment gas through a plasma reactor and of generating a plasma in the reactor, substantially at the atmospheric pressure, in order to produce a plasmochemical reaction between the treatment gas and the core surfaces so as to form surface layers on the cores, as said mixture flows through the reactor. Advantageously, the composite powders are formed through the deposition of a film in a plasma medium at the atmospheric pressure, which makes it possible to provide a method and an industrial device, which are simple, reliable, cheap and which enable a high productivity. The plasma acts to heat up and activate the surface of the cores before contacting the same with atoms and/or molecules selected for generating the surface film. The parameters of the plasma controlling the deposition of the surface film and of the plasma activating the cores can be selected in such a manner that the deposition produces a film, which is homogeneous and very thin.

In the present invention, powders can be prepared, which are comprised of grains having a core and one or several peripheral regions resulting from the deposition of one or of several films which are thin, uniform and homogeneous and which are comprised of atoms and/or of molecules (radicals), in order to confer to the resulting powder properties which are different from the properties of a powder comprised of the cores only.

According to an advantageous aspect of the invention, before the passage of the cores and of the treatment gas through the region of treatment by the plasma, they are passed through a hydrodynamic filter, provided, for example, in the form of a filter with multiple longitudinal channels (of the honeycomb type) acting to uniformise the velocity and the direction of the flow of the cores and of the gas through the plasma reactor. This makes it possible to uniformise and better regulate the parameters controlling the treatment, such as the duration of travel of the cores through the reactor, the temperature, the pressure and the relative velocity of the cores in the gas. One thus improves the uniformity of the treatment of the cores and, more particularly, the uniformity and the homogeneity of the thickness of the surface layers formed on the cores. Also, this disposition makes it possible to minimise the dispersion of the dimensions and of the properties of the powders obtained.

According to an advantageous aspect of the invention and in order to stimulate the process, acoustic vibrations are generated in the plasma, in particular ultrasonic vibrations. The vibrations are transmitted to the cores via the gas. The vibrations can be generated by an external generator of acoustic vibrations or through a special method of generating the plasma in accordance with an advantageous aspect of the invention. To this end, the plasma can be generated by pulses, the duration of the leading edge of the voltage pulses, the duration of the pulses and their frequency being selected in such a manner as to regularly generate shock waves in the plasma. These shock waves generate—through the interferences created, on the one hand, with the walls of the reactor and, on the other hand, with the plasma particles—oscillations and, in particular, ultrasonic oscillations, which enhance considerably the deposition of the film.

It is advantageous to inject along the inner surface of the wall of the reactor, a neutral gas of a specific gravity close to that of the gases of the mixture, in order to limit the adverse effects of the boundary layer. Actually, the gases and the particles in the boundary layer, in view of the velocities at which they are carried and which are substantially different from those of the central particles, undergo a thermal treatment which is different from that of the central particles and this results in a powder lacking homogeneity and uniformity. The presence of the gas has the effect, on the one hand, of cooling the wall of the reactor and insulating the same from the hot plasma and, on the other hand, of excluding the cores and the reactive gas from the boundary layer.

The homogeneity of the grains can be further improved by providing an escape channel downstream of the treatment region of the plasma reactor and along the wall thereof, for the purpose of evacuating the gases and the grains flowing in the boundary layer of the walls. The velocity of the gases close to the wall, i. e. in the boundary layer, is lower than in the major central part of the flow column extending through the reactor, so that the treatment parameters are not the same for the particles in the boundary layer and for those in the central part. By evacuating the peripheral grains and the peripheral gas, one can obtain powders having grains which exhibit a high degree of homogeneity.

In order to form surface layers of different molecules or atoms, there can be provided several treatment devices placed one above the other or the device can be designed with several plasma reactors placed one above the other and spaced apart by chambers for mixing the treatment gas with the cores introduced into the device and arriving from the corresponding upstream stage of plasma treatment.

Other advantageous objects and characteristic features of the invention will become apparent from the claims, from the description of embodiments of the invention made hereafter and from the appended drawings, in which:

Figures 1, 1A, 1B:
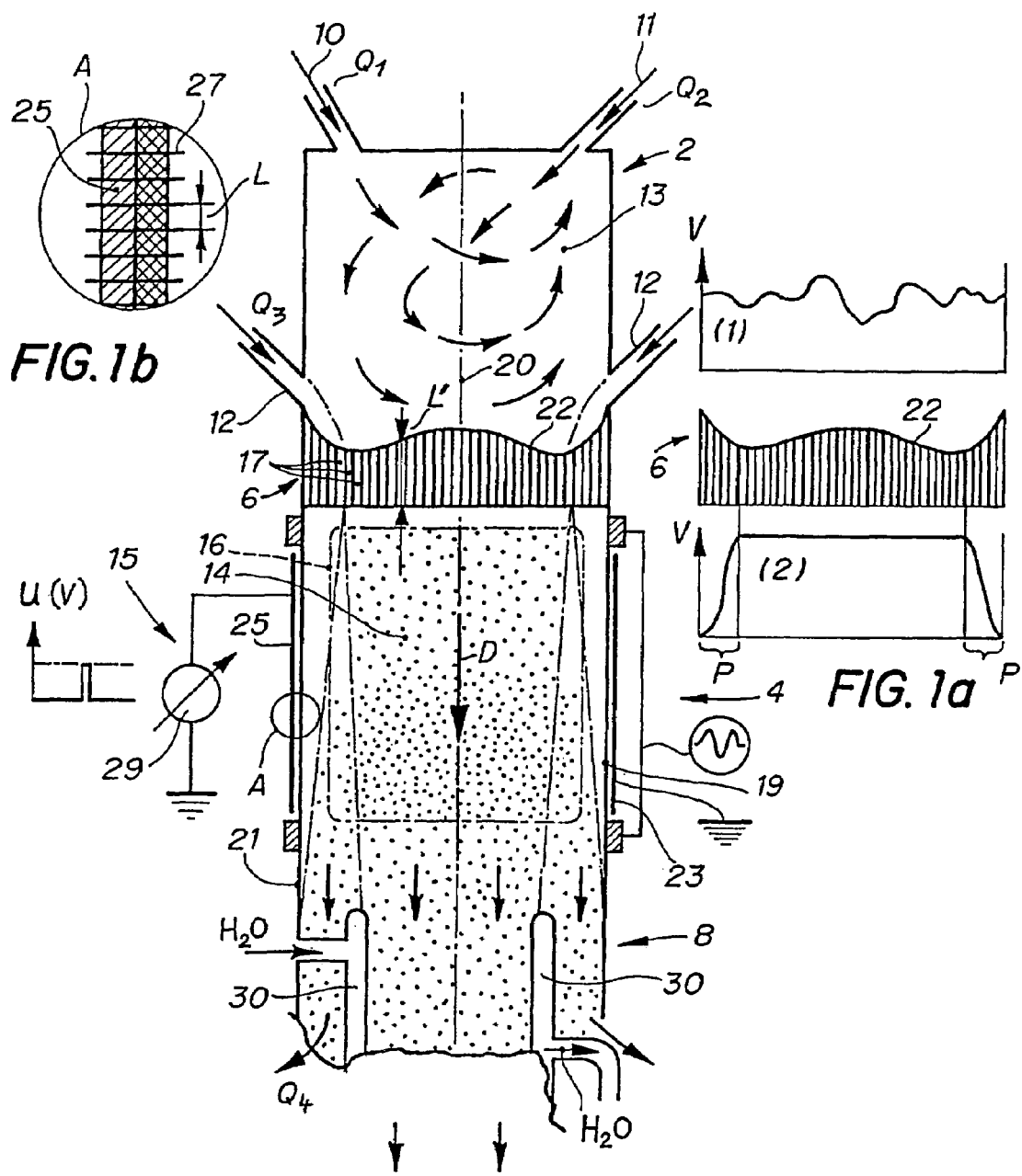
FIG. 1 is a schematic cross-sectional view of a device for producing a composite powder through the use of plasma, in accordance with the invention.
FIG. 1a is a graphical illustration of the profiles of the velocity of the gas and/or of the cores before and after a hydrodynamic filter of the device, arranged upstream of a plasma treatment region.
FIG. 1b is a partial cross-sectional view of the wall of the plasma reactor of the device of FIG. 1.

With reference to FIG. 1, a device for the production of a composite powder through the use of a plasma with the first embodiment in accordance with the invention comprises a mixer part 2, a plasma reactor 4, a hydrodynamic filter 6 arranged between the mixer part and the reactor and a collector part 8 at the outlet of the reactor. The mixer part is arranged upstream of the reactor with respect to the direction D of the flow of the gas and of the particles in the device and it includes inlets 10, 11 for the introduction of the gas and of the cores, an inlet 10 being used for the introduction of the cores with a carrier gas Q1 and the other inlet 11 being used for the introduction of a treatment gas Q2 for forming the surface layers of molecules or of atoms on the cores. The inlets can be designed as nozzles directed towards the centre of the chamber 13 of the mixer, so as to produce a turbulent flow and a mixing of the gas acting as a carrier for the cores and of the treatment gas. The mixer part can also include lateral inlets 12 for neutral gases Q3 directed to flow along the inner surface of the wall of the device. The neutral gas is advantageously inert and has, preferably, a specific gravity close to that of the mixture of the carrier gas and of the treatment gas.

The reactor 4 includes a plasma generating device 15 designed for generating a plasma in the chamber 14 of the reactor, to define a treatment region, indicated by the phantom line 16. The plasma generator can vary in its design, depending on whether a capacitive plasma generator 15, an inductive high-frequency (HF) plasma generator 15' or a microwave plasma generator 15" (see FIG. 3) is used.

Each one of these generators can function either in a continuous mode or in a pulsed mode. One of the preferred methods for generating plasma makes use of pulses with characteristics selected in such a manner as to generate plasmas producing interference creating shock waves. In particular, the duration of the leading front of the voltage pulses, the duration of the pulses and their frequency are selected in such a manner as to generate regularly shock waves in the plasma. These shock waves create interferences, on the one hand, with the walls of the reactor and, on the other hand, between themselves and with the plasma particles, to generate oscillations, in particular ultrasonic oscillations of the medium, thus stepping up significantly the deposition of the film. The process of generating a pulsed atmospheric plasma makes it possible to create a uniform plasma in a given volume.

The plasma reactor 4 can have a shape, which is substantially parallelepipedal, with two opposite faces 19, 21 being covered by electrodes 23, 25. One of the electrodes 23 carries metal needles 27 and is connected to a source 29 of pulsed high frequency electric power. The other electrode 23 is planar and is grounded.

In FIG. 1, there is represented a plasma generator of a parallelepipedal construction (with a planar geometry).

It is also advantageous to design the plasma generator with a coaxial geometry. In this case, the electrodes are shaped as two coaxial cylinders, between which the gaseous mixture travels parallelly to the axis and filamentous discharges are generated axially, which create the activating plasma medium. For reasons of safety, it is advantageous to connect the central electrode, on which needles are implanted in this case, to the source of high frequency current and to ground the other electrode.

In operation, the electrical discharge emitted from the needles 27 has initially the form of irregularly shaped cylindrical channels having a diameter d (d~0.5 mm) and extending from the electrode 25 to which a voltage is applied to the grounded electrode 23. The duration $t_1$ of the leading edge of the voltage pulses is selected in such a manner that the heating up of the channel be isochoric., i. e. that $t_1 \leq d/a$, where a is the speed of sound in the medium.

The pressure increases in the channel, reaches and exceeds the critical value required for creating a shock wave, which propagates in the radial direction.

The propagating shock wave ionises the medium. The channel broadens rapidly and the plasma is power supplied by the increasing current travelling therethrough.

The pulse has a duration $t_2$ selected in such a manner as to ensure the passage of the current through the entire section of the conduit: $t_2 \sim L/a$, where L is the distance between the needles of the electrode to which a voltage is applied. The passage of the current is then interrupted for a duration of time $t_3$, which is lesser than or equal to the relaxation time (deionisation time) of the gaseous medium in which the discharge is produced. This interruption does not allow the discharge to contract or become localised. The relaxation time of the system depends on the properties of the gaseous medium in which the discharge is produced and on the hydrodynamic parameters thereof. It is selected and optimised empirically. During the operation of the plasma generator, the medium is excited in a homogeneous manner, in the entire volume of the plasma, the uniformity being due, in particular, to the interference of the shock waves produced from different channels.

By way of example, in the practical case of a mixture comprised of argon (80%) and of HDMS vapours (15%) and of iron cores (5%), the plasma generator functioned satisfactorily with the following values:

$t_1 = 3 \cdot 10^{-7}$ sec $t_2 = 10^{-5}$ sec ($L = 5 \cdot 10^{-3}$ m)

$t_3 = 10^{-4}$ sec

The frequency of the generator was 13.65 MHz.

The hydrodynamic filter 6 placed between the mixer and the plasma reactor is designed for making uniform and for stabilising the flow of the gaseous mixture, so as to impart to the same a velocity profile V which is relatively constant through the columnar gas flow, as illustrated in FIG. 1a. It can be seen in FIG. 1a that the longitudinal velocity V(1) of the gaseous mixture in the mixer part is not constant and that its profile is chaotic, whereas after the passage through the hydrodynamic filter 6, the longitudinal velocity V(2) of the gaseous mixture is substantially uniform, except at the periphery P which is filled with the neutral gas Q3 introduced through the lateral inlets 12. The neutral gas forms the substance of the boundary layer on the inner surface of the wall of the reactor, acting, on the one hand, to cool and insulate the wall of the reactor from the hot plasma and, on the other hand, to keep the cores away from the boundary layer. The gas in the boundary layer is separated from the main flow and evacuated at the outlet of the reactor, as will be described hereafter.

Preferably, the hydrodynamic filter includes small longitudinal channels 17 aligned along the direction D of the flow of the gaseous mixture through the reactor, with the channels having a length, which can vary as a function of their distance from the centre 20 of the casing. The length L' of the channels influences the resistance to the gas flow through the filter and the variation of the length of the channels can be determined empirically, depending on the geometry and on the width of the chambers 13, 14 and also on the flow rate. As the velocity at the centre of the column of the gaseous mixture is normally higher than at the periphery, the profile 22 of the hydrodynamic filter 6 has, preferably, a shape which is convex, such as illustrated in FIG. 1 and in FIG. 1a. The hydrodynamic filter can have a "honeycomb-like" structure.

At the outlet of the reactor (collector part 8), the device includes a peripheral evacuation channel 28 designed in such a manner as to collect the gases and the particles Q4 only at the periphery of the flow. This makes it possible to remove the cores and the particles of powder which travelled along the wall within the boundary layer and which underwent a treatment which was different from that of the grains in the major central part of the flow, as a result of the non uniform flow velocity in the boundary layer and of the presence of the neutral gas Q3.

The collector part 8 can include a cooling circuit 30 provided for protecting it from a thermal destruction and for cooling the gaseous mixture and the powder grains exiting from the reactor and collected by a filter or some other separator (not illustrated) of a conventional type as used in the manufacture of powders.

Figure 2:
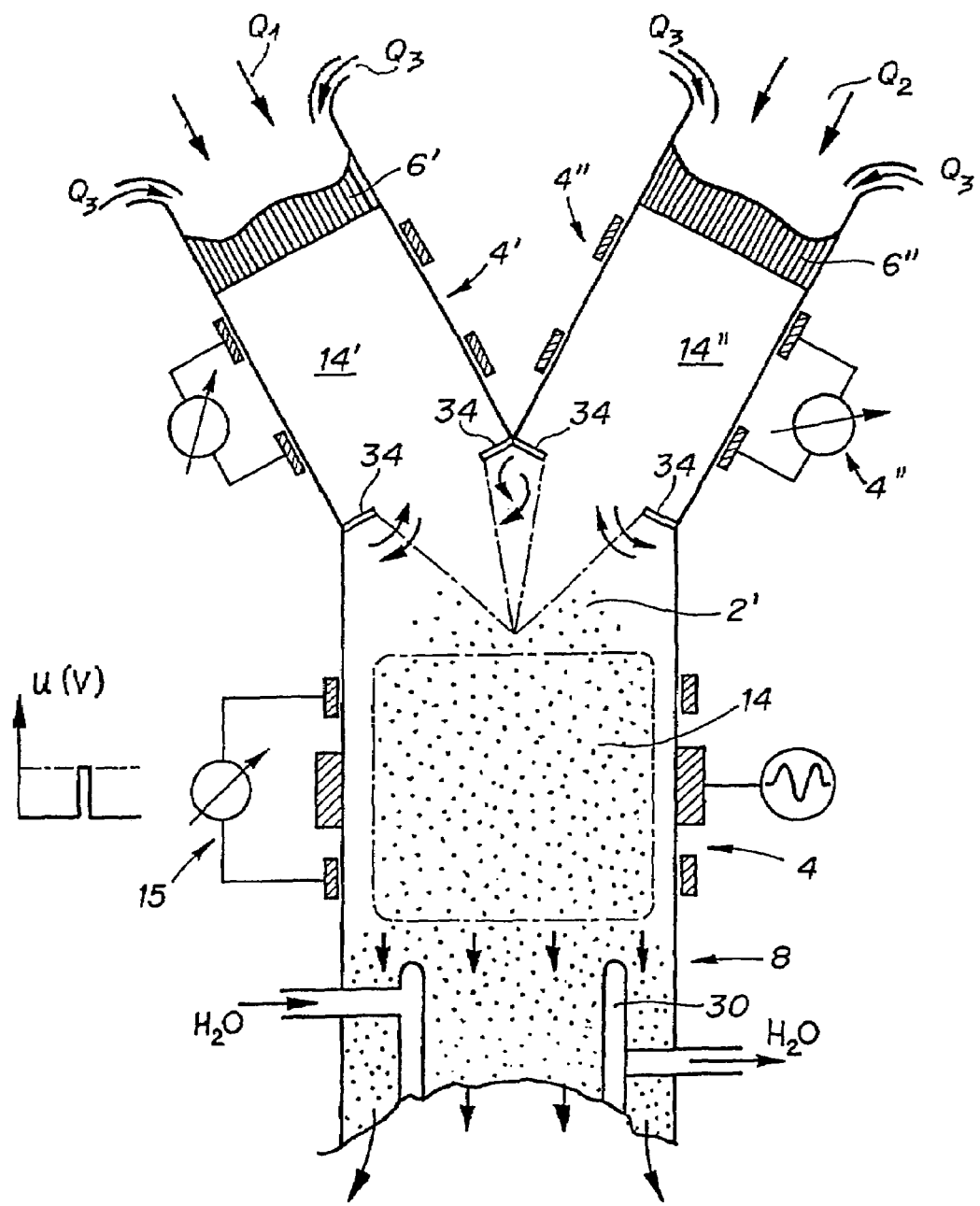
FIG. 2 is a schematic cross-sectional view of a device for producing a composite powder through the use of a plasma, according to a second embodiment of the invention.

FIG. 2 illustrates a second embodiment of a device for producing a powder of composite grains in accordance with the invention. In this case, the device includes separate plasma pre-treatment reactors 4', 4" into which the carrier gas Q1 carrying the cores and the treatment gas Q2 are introduced, respectively. Also, a neutral gas Q3 can be injected along the walls of each pre-treatment reactor to form a boundary layer as described previously in relation with the embodiment of FIG. 1.

Each pre-treatment reactor 4', 4" is provided with a hydrodynamic filter 6 at its inlet for making uniform the profile of the longitudinal velocities of the gases introduced into these reactors. The outlet of the pre-treatment reactors is in communication with a common main plasma reactor, in which the carrier gas carrying the cores and the treatment gas are mixed. Turbulence creating elements or blades 34, which are advantageously cooled, are provided at the outlet of the pre-treatment reactors, in order to create a turbulence in the respective flows for ensuring a good mixing of the treatment gases and of the cores in the mixer chamber part at the inlet of the main plasma reactor 4 and, consequently, in the treatment region 14 of the main reactor.

The length of the flow path between the pre-treatment plasma reactors 4', 4" and the main reactor 4 is such that the cores and the gases activated in the pre-treatment regions 14' and 14" are not deactivated (i.e. the residence time is lesser than the relaxation time).

Accordingly, in the second embodiment, the flow of the treatment gas Q2 and the flow of carrier gas Q1 carrying the core powder are introduced into separate plasma pre-treatment reactors 4', 4". Hydrodynamic filters 6 are used for ensuring a homogenisation of the two flows, while neutral gases Q3 are injected peripherally and the subsequent activation is ensured in the plasma regions 14', 14". The two flows then merge together. In order to ensure a thorough mixing, turbulence is created by means of devices 34 disturbing the flow. The activated mixture enters a second plasma region 14, in which a renewed activation is carried out, which catalyses the deposition process of the film on the cores. In this process, it is important that the time elapsed between the pre-treatment and the contacting of the particles of the treatment gas with the cores be lesser than the relaxation time from the excited state of the components activated by the pre-treatment plasma. The evacuation of the gas and of the grains of the boundary layer as well as the collecting of the powder of composite grains are carried out as in the previous embodiment.

Figure 3:
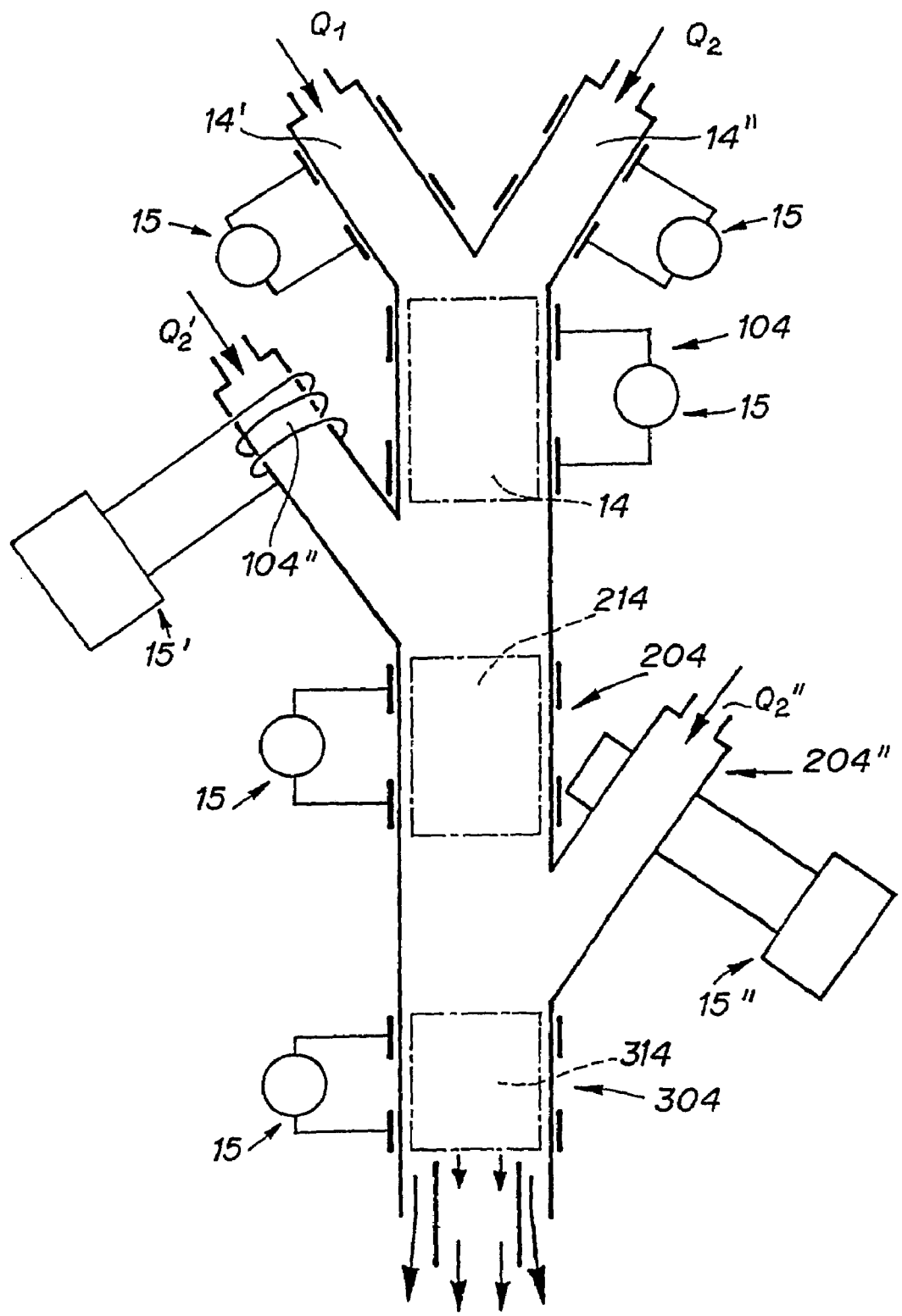
FIG. 3 is a schematic cross-sectional view of a device for producing a composite powder through the use of a plasma, according to a third embodiment of the invention.

FIG. 3 illustrates another embodiment of the present invention. In this case, the purpose is to create a superposition of films of different compositions and having different physicochemical properties, on the same core. This process is carried out using a device, which comprises several stages of plasma reactors, 104, 204, 304.

The first stage 104 of the device of FIG. 3 has substantially the same characteristic features as the device shown in FIG. 2. Downstream of the first stage 104, there is injected into the flow containing the grains coated with a first layer, a treatment gas Q2' of a new chemical composition, which makes it possible, in the plasma treatment region 214 of the second stage 204, to deposit a new layer on the grains. The new treatment gas Q2' can be subjected to a pre-treatment (activation) by a plasma in a pre-treatment plasma reactor 104' of the device, arranged at the outlet of the first stage. In a similar manner, a third layer is deposited in the treatment region 314 of the third stage 304, from a treatment gas Q2" of a new composition, injected upstream of the third reactor. As in the preceding stage, the new treatment gas Q2" an undergo a pre-treatment (activation) by the plasma of a pre-treatment plasma reactor 204" of the device, arranged at the outlet of the second stage. The device can include additional stages, so that the process may be repeated subsequently, a number of times equal to the number of layers desired on the initial core.

In the processes according to the invention described above, the components of the plasma generating the film are selected in such a manner that the attraction forces between the particles of the film exhibit a centripetal component assisting in the solidification of the structure of the envelope of the peripheral film. This component is all the greater as the size of the cores is smaller and is particularly important in the case of powders of submicronic and nanometric cores. In such cases, in order to well separate the core grains floating in a carrier gas (for instance, argon) and, furthermore, to confer to the same an artificial vibrational motion, capable of catalysing the deposition process, they can be subjected to the action of acoustic vibrations, in particular ultrasonic vibrations. These vibrations can be generated by an external generator or by the plasma itself, when using a pulsed mode plasma generation, as will be described hereafter.

In order to ensure an efficient deposition of the film, it is important to activate (excite) the treatment gas containing the chemical components (for example a mixture of hexamethyldisilazane and of oxygen). The electrons of the plasma heat up the treatment gas and, furthermore, they excite the atoms and molecules, which undergo a decomposition to produce radicals. In the excited state, these activated particles are quite capable of forming on a solid surface, for example on the surface of the cores, a film exhibiting physicochemical properties, such as optical properties, which are different from those of the core.

In view of the fact that the deposition of the film is a process which is subject to saturation, whereby the rate of deposition decreases exponentially with the thickness, it has proven useful, in some cases, to incorporate an excess of the chemical components into the treatment gas.

Under such circumstances, the composite grains of the powder will be made automatically uniform and homogeneous. Accordingly, it is advantageous to adjust the flow rate of the treatment gas in such a manner as to operate under conditions of saturation. The thickness of the layer deposited on the core under saturation conditions is controlled by the duration of the exposure of the cores to the activated treatment gas in the plasma treatment region.

To improve this process, the initial cores can be subjected to a preliminary excitation, for instance by heating them up, or by exposing them to radiations, or further by subjecting them to the action of a plasma. In this case, the electrons of the plasma will activate the superficial bonds of the atoms located on the surface. These atoms will remain excited for the duration of the relaxation time, within which these cores will have to meet (activated) particles of the treatment gas, in order that the formation of said film may proceed.

It is advantageous, for ensuring that the method proceeds efficiently, that the energy spent for the purpose of exciting (in particular, thermally) the atoms or the molecules of the gas be greater than their respective excitation energy. Experiments carried out in the framework of this invention show that, in practice, this energy should exceed 0.02 eV/atom or molecule. This limit value of the energy spent is empirical and can be estimated experimentally in the following manner, in the case of a plasma excitation:

the power $P_1$ input from the electrical power source is measured, the power $P_2$ lost by cooling is measured calorimetrically, the power $P_3$ emitted as radiations is, measured by radiometry, when relevant, the flow rate G of the gas treated by the plasma is measured The ratio: $(P_1-P_2-P_3)$ α/G, in which α is the accommodation coefficient $\sim 10^{-2}$ yields the value needed.

On the other hand, the energy spent must not exceed the energy of destruction of the cores (for example through ablation). This means that the energy spent per particle should satisfy the following relation:

$$E_{dep} \leq (C \cdot \Delta T_{destr} \cdot d \cdot G)/(n_{gas} \cdot v_{term} \cdot L \cdot S \cdot \alpha)$$

in which:

C is the thermal capacity of the material of the core, $\Delta T_{dest}$ is the temperature of destruction of this material (for example, the sublimation temperature), d is the effective diameter of the core, G is the flow rate of the gas carrying the components through the plasma, $N_{gas}$ is the specific gravity of this gas, $V_{term}$ is the thermal speed of the particles of this gas, L is the length of the reactor, S is the cross-section of the reactor, α is the accommodation coefficient.

The process according to the invention is advantageous for obtaining powders with special physicochemical properties, for example exhibiting optical effects useful for the manufacture of colours and varnishes.

EXAMPLE 1

Device according to FIG. 1

| | |
|---|---|
| Powder of cores: | Fe |
| Carrier gas for the cores: | argon |
| Treatment gas: | argon + $O_2$ + hexamethyldisilazane vapours |
| Plasma: | high frequency, 13.56 MHz, power 35 kW |
| Effective core diameter: | d = 700 nm |
| Gas flow rate at the outlet of the reactor: | G = 10 l/s |
| Cross-section of the plasma reactor: | S = 6 $cm^2$ |

Result: formation of an $SiO_2$ film of a thickness of ~100 nm over the surface of the Fe grains.

EXAMPLE 2

Device according to FIG. 3

| | |
|---|---|
| Powder of cores: | Fe |
| Carrier gas: | argon |
| Treatment gases: | |
| 1st reactor: | Ar + $O_2$ + hexamethyldisilazane vapours |

-continued

| | |
|---|---|
| 2nd reactor: | Ar + $O_2$ + titanium tetrachloride vapours |
| Plasma: | |
| 1st reactor: | high frequency, 13.56 MHz, power 35 kW |
| 2nd reactor: | high frequency 13.56 MHz, power 20 kW |
| 3rd reactor: | not operated |
| Effective core diameter: | 0.7 μm |
| Gas flow rate at the outlet: | 10 l/s |
| Cross-section of the plasma reactor: | 6 cm$^2$ |

Result: formation over the surface of the Fe grains, of a double film comprised of:
1) an $SiO_2$ layer, thickness ~100 nm and
2) a $TiO_2$ layer, thickness ~50 nm

The invention claimed is:

1. A method for producing a powder made of composite grains having a core and one or several surface layers, includes the steps of: mixing grain cores with a plasmochemical treatment gas, passing through a main plasma reactor a flow of the mixture of the cores and of the treatment gas, and generating a uniform plasma substantially at the atmospheric pressure, in a treatment region of the main reactor, in order to produce a plasmochemical reaction between the treatment gas and the surfaces of the cores, so as to form surface layers thereupon, as said mixture flows through the reactor.

2. A method for producing a powder according to claim 1, wherein the surface of the cores is activated beforehand, upstream of the plasma treatment region of the main reactor.

3. A method for producing a powder according to claim 1, wherein the excitation energy of the atoms or of the molecules of the treatment gas generating the layer deposited on the cores is between 0.02 eV per atom or molecule and the thermal decomposition energy of the core.

4. A method according to claim 1, wherein the plasma is generated by pulses, of which the leading edge, the duration and the frequency are such that shock waves are generated which produce acoustic vibrations.

5. A method according to claim 1, wherein acoustic vibrations are generated in the plasma by means of an external acoustic generator.

6. A method according to claim 1, wherein the treatment gases and the carrier gas containing the cores are mixed homogenously together upstream of the plasma treatment region.

7. A method according to claim 6 wherein the flow of the gaseous mixture is made uniform before its excitation by the plasma, by means of a hydrodynamic filter.

8. A method according to claim 1, wherein a neutral gas is injected along the walls of the plasma reactor or reactors, to form the limit gas layer on the inner surface of said walls.

9. A method according to claim 1, wherein the flow of treatment gas and the flow of the carrier gas carrying the cores are excited separately and contacted with each other after having been excited, the time elapsed between the excitation and their contacting with each other being shorter than the relaxation time of the excited components of the gas and of the cores.

10. A method according to claim 1, wherein the flow rate of the treatment gas is selected in such a manner as to achieve a saturation in the deposition process of the surface layer on the cores, the thickness of the deposited layer being controlled by the residence time of the cores in the plasma treatment region by the treatment gases.

11. A device for carrying Out a method for producing a powder comprised of composite grains having a core and one or several surface layers according to claim 1, including a main plasma reactor (4, 10, 204, 304) operating at atmospheric pressure, the reactor including a plasma generating device (15) and a chamber (14) defining a plasma treatment region through which flows a mixture of a plasmochemical treatment gas and of cores, and a mixer part (2, 2') upstream of the treatment region, for mixing together the treatment gas and the cores carried by a carrier gas, wherein it comprises at least one hydrodynamic filter (6, 6', 6") upstream of the plasma treatment region, for the purpose of making uniform the mixture of the gas and of the cores travelling through the hydrodynamic filter.

12. A device according to claim 11, wherein the hydrodynamic filter is provided between the mixer part (2) and the plasma treatment region (14).

13. A device according to claim 11, wherein it includes plasma pre-treatment reactors (4', 4") upstream of the main plasma reactor, which make it possible to activate separately the flow of treatment gas and of the cores carried by a carrier gas.

14. A device according to claim 13 wherein each plasma pre-treatment reactor is provided with one of said hydrodynamic filters upstream of the corresponding plasma treatment region (14', 14").

15. A device according to claim 11, wherein it comprises one or several external sources of acoustic vibrations.

16. A device according to claim 11, wherein the plasma generating device comprises means for generating the plasma by pulses.

17. A device according to claim 11, wherein it comprises lateral inlets (12) for injecting a neutral gas along the inner surface of the wall of the plasma reactor or reactors (4, 4", 4"').

18. A device according to claim 11, wherein it includes a collector part (8) at the outlet of the device, comprising a peripheral channel for evacuating the gases and the cores travelling in the boundary layer along the inner surface of the reactor.

19. A device according to claim 11, wherein the hydrodynamic filter comprises a plurality of small longitudinal channels aligned in the direction of the flow through the reactor it precedes.

20. A device according to claim 19, wherein the length of the longitudinal channels is greater at the centre of the filter than when moving away from the centre.

21. A device according to claim 19, wherein the channels are defined by the thin walls of a structure which is substantially built as a honeycomb.

22. A device according to claim 11, wherein the plasma generating device comprises electrodes (23, 25) arranged respectively on two opposite sides of the plasma treatment region (14), wherein one of the electrodes carries metal needles (27) distributed over the surface of the electrode while being directed towards the other electrode and wherein the HF current source is a pulsed source.

23. A device according to claim 22, wherein the plasma reactor is parallelepipedal and in that the electrodes are arranged on opposite faces running parallel to the direction of the flow of gas.

24. A device according to claim 23, wherein the plasma reactor is cylindrical and is comprised of two coaxial electrodes having their axes running parallel to the direction of the flow of gas.

25. A device according to claim 24, wherein the central electrode is connected to the pulsed HF current source and in that it includes metal needles, while the peripheral electrode is grounded.

* * * * *